(12) United States Patent
Chen

(10) Patent No.: US 7,166,206 B2
(45) Date of Patent: Jan. 23, 2007

(54) PLASMA ELECTROPLATING

(75) Inventor: Zhuping Chen, Beijing (CN)

(73) Assignee: Chak Man Thomas Chang, Chapel Hill (AU)

( * ) Notice: Subject to any disclaimer, the term of this patent is extended or adjusted under 35 U.S.C. 154(b) by 451 days.

(21) Appl. No.: 10/130,582

(22) PCT Filed: Nov. 8, 2001

(86) PCT No.: PCT/AU01/01435

§ 371 (c)(1),
(2), (4) Date: Sep. 10, 2002

(87) PCT Pub. No.: WO02/38827

PCT Pub. Date: May 16, 2002

(65) Prior Publication Data

US 2003/0052011 A1    Mar. 20, 2003

(30) Foreign Application Priority Data

Nov. 8, 2000    (AU) ..................................... PR1299

(51) Int. Cl.
C25D 5/00 (2006.01)
(52) U.S. Cl. ...................... 205/316; 205/322; 205/323; 205/333; 427/569; 427/570
(58) Field of Classification Search ........... 422/186.04; 205/183, 188, 87, 705; 427/569, 570; 204/164
See application file for complete search history.

(56) References Cited

U.S. PATENT DOCUMENTS

| | | | | |
|---|---|---|---|---|
| 4,447,299 A | * | 5/1984 | Kasaaian et al. | ............ 205/243 |
| 5,700,366 A | * | 12/1997 | Steblianko et al. | ........... 205/87 |
| 5,759,243 A | * | 6/1998 | Johnson et al. | ............ 106/1.25 |
| 6,368,467 B1 | * | 4/2002 | Andrews et al. | ............ 204/164 |

OTHER PUBLICATIONS

T. Paulmier et al., "A New Thin Film Deposition Process By Cathodic Plasma Electrolysis", The Australian Institute of Physics, 28th Annual Condensed Matter and Materials, Feb. 3-6, 2004, WP37.*

* cited by examiner

Primary Examiner—Kishor Mayekar
(74) Attorney, Agent, or Firm—Mintz, Levin, Cohn, Ferris, Glovsky and Popeo, P.C.

(57) ABSTRACT

A method for depositing a film of an advanced material on a surface of an article is disclosed. The method comprises placing the article within a bath having a pair of spaced electrodes one of which is formed by the article and an electrolyte containing a source of the material to be deposited. A stream of bubbles is generated within the electrolyte adjacent to the cathode. A potential difference is applied across the cathode and anode such that a plasma glow discharge is formed in the bubble region. The plasma of ionised gaseous molecules formed within the bubble region acts to deposit a film of material on the surface of the article. The method may be carried out at atmospheric pressure and does not require a vacuum apparatus. An apparatus for carrying out this method is also disclosed.

20 Claims, 12 Drawing Sheets

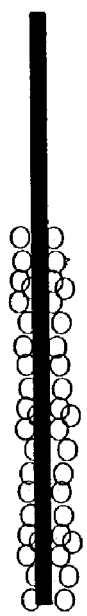 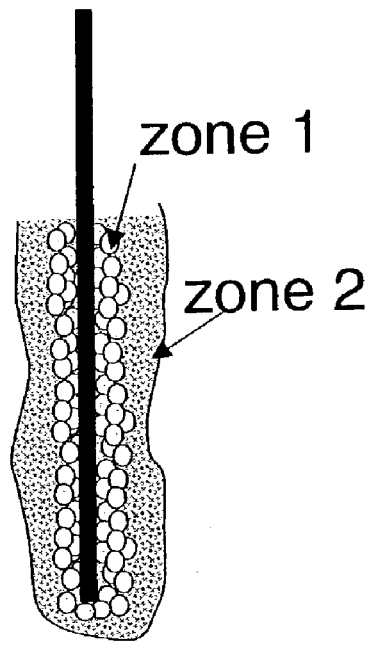
Fig 5　　　　　　　　Fig 6
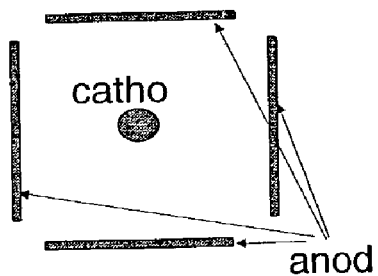 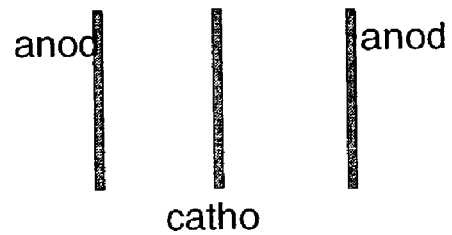
Fig 7　　　　　　　　Fig 8

PLASMA ELECTROPLATING

This application is a 35 U.S.C. 371 National Stage filing of PCT/AU01/01435 on Dec. 11, 2001.

FIELD OF THE INVENTION

This invention relates to the deposition of materials, e.g. metals and non-metals, on the surface of an article.

More specifically this invention relates a method or process for the deposition or coating of metals, semi-metals and non-metals on the surface of an article and an apparatus for carrying out this method.

The invention relates particularly but not exclusively to a plasma electroplating process (PEP) for plating films, e.g. thin films, of advanced materials such as carbon, titanium, and silicon on the surface of the articles. It will therefore be convenient to hereinafter describe the invention with reference to this example application. However it is to be clearly understood that the invention is capable of broader application. For example the invention extends to advanced materials other than those indicated above. The method also extends to many other materials such as copper, tin and gold which can be deposited on an article by conventional electroplating techniques.

DEFINITIONS

In the specification the following terms shall be interpreted to have the meanings indicated.

Advanced materials refer to materials which cannot usually be deposited by conventional electroplating techniques.

Plating shall be interpreted broadly and to include all methods of depositing a coating or film on articles.

Films shall be interpreted broadly and include within its scope coatings having a wide variety of thicknesses.

Plasma shall be interpreted to mean a body of ionised gaseous molecules that is undergoing glow or arc discharge. The number of positive and negative ions is equal. In addition there may be unionised atoms or molecules.

The term "comprising" shall be understood to have a broad meaning similar to the term "including" and will be understood to imply the inclusion of a stated integer or step or group of integers or steps but not the exclusion of any other integer or step or group of integers or steps. This definition also applies to variations on the term "comprising" such as "comprise" and "comprises".

BACKGROUND TO THE INVENTION

A process known generally by the term "electroplating" is a well known technique for plating a metal onto a surface of an article.

Typically the process is carried out in a cell containing an anode, a cathode which is formed by the article to be plated, and also a liquid electrolyte. The electrolyte contains ions of the metal to be plated. A potential difference is applied across the electrodes driving the deposition of metal ions on the cathode. This process has been used for a long time to plate metals such as copper (Cu), tin (Sn), zinc (Zn) and gold (Au) onto metallic surfaces. Other materials that can be plated out on an article by conventional electroplating techniques include: Cr, Ni, Fe, Co, Cd, Pb, Ag, In and Pt. The purpose for coating a metal with such a plating varies. Sometimes metals may be coated to reduce their susceptibility to corrosion. Other times they may be coated with e.g. gold to increase their aesthetic appeal and value.

However while there are a large number of materials that can be deposited by electroplating techniques there are many other materials, e.g. so-called advanced materials, that are not able to be deposited by conventional electrode plating techniques. This is because the electrode chemical series of the metal simply does not permit deposition with the voltages that would ordinarily be used.

Clearly it would be advantageous if a technique could be devised for depositing or plating these advanced materials on the surface of an article. This would open up a plethora of new options in this exciting field. It would open up numerous new possibilities in terms of the type of materials that could be deposited and flowing from this would be a multitude of new applications for the deposition of thin films.

Currently the deposition of advanced materials is accomplished by means of ion vapour deposition or sputtering techniques. For all practical purposes these are required to be carried out in a vacuum chamber. These processes do have some limitations. Firstly fairly sophisticated vacuum equipment is required to carry out the process. Secondly some sputtering techniques are directional and may therefore be primarily suitable for coating one surface of articles. Such devices are not designed to circumferentially coat surfaces and may not be able to coat surfaces having a widely varying three dimensional configuration. Thus the number and size of the articles can be limited by the size of the vacuum chamber. Further the product turnaround time is long. Temperatures are high and as a result delicate and heat sensitive materials cannot be coated by this process.

The current application is squarely focused on this challenge.

SUMMARY OF THE INVENTION

According to one aspect of this invention there is provided a method for depositing a material on a surface of an article, comprising:

placing the article within a bath of liquid having a pair of spaced electrodes, namely a cathode and an electrode, one of which is formed by said article and an electrolyte;

generating a stream of bubbles containing a source of the material to be deposited within the electrolyte in a region adjacent to the cathode;

applying a potential difference across the cathode and anode such that a glow discharge is formed in the bubble region so as to form a plasma of ionised gaseous molecules within the bubbles;

whereby a film of material is plasma deposited on the surface of the article.

The high energy ions generated in the plasma interact with the surface and are then deposited on the surface. The ionised gas molecules in the plasma are in a state of high excitation and energy and this enables them to be firmly deposited on said one electrode. Thus the plasma enhances the deposition process.

The formation of a glow discharge region adjacent said one electrode is caused by a dielectric breakdown in the bubbles surrounding the electrode. The bubbles have a low electrical conductivity and as a result there is a large voltage drop between the electrodes across this bubble region. This voltage drop accounts for a large portion of the overall voltage drop across the electrodes.

The plasma is generated within the bubbles contained within the electrolyte. This serves the purpose of the liquid electrolyte acting as a containment for the plasma within the bubbles. The bubbles contain precursor materials originating in the liquid electrolyte. This material may have been transferred from the liquid to the bubbles by diffusion or evaporation. Alternatively the precursor may be introduced directly into the bubbles from outside the system.

The articles may be formed from all kinds of conductive materials, and non-conductive materials coated with a conductive layer on the surface to be coated. Suitable conductive materials include metallic materials such as steel, titanium, aluminium and the like. They also include semi-metals and semi conductors such as silicone, conductive inorganic materials such as tungsten carbide, and conductive organic materials such as ABS plastics. For example a non-conductive substrate coated with a conductive layer may be glass coated with Indium-Tin-Oxide (ITO), ceramics or a plastic substrate coated with a conductive organic or silver overcoat. Preferred examples include steels, silicone, glass coated with ITO, titanium, aluminium and corresponding alloys.

The generation of bubbles may be accomplished by one or more of the following:

electrolysis, ebullition, cavitation, entrainment, sparging, chemical reaction, dissociation by electrons and ion collisions.

Electrolysis bubbles may be generated by the electrode as a result of the potential differences applied thereacross, eg. hydrogen bubbles liberated by the cathode or oxygen bubbles liberated by the anode. Ebullition bubbles may be generated by electrical heating in the region of the electrodes. The bubbles may be generated by direct electrical heating or by heating in proximity to the electrode by a moving wire or grid. Microwave heating and heating using lasers may also be used to generate ebullition bubbles.

Cavitation bubbles may be generated by using an ultra sonic bubble generator or a jet of fluid or a jet of a mixture of gas and liquid injected into the electrolyte in proximity to the electrode. Cavitation bubbles may also be generated by hydrodynamic flow of the electrolyte in proximity to the electrode. Sparging of gas in proximity to the electrode may also be used to generate bubbles.

Bubbles may also be generated by a chemical reaction which evolves gas as a reaction product. Typically such reactions involve thermal decomposition of compounds in the electrolyte or acid based reactions in the electrolyte. Bubbles may also be formed in the electrolyte by adding a frother thereto.

Typically the generation of bubbles forms a bubble sheath around said one electrode. The bubble sheath may have a thickness of from a few nanometers to say 50 millimeters. Typically the bubble sheath may have a thickness of 1 to 5 mm. Further it should be understood that the bubbles may not be homogeneous throughout the sheath.

The bubbles may be generated either from components contained within the liquid electrolyte or externally by introducing a gas or vapour or gas liquid mixture from outside the cell.

The step of forming a glow discharge in the bubble region may be achieved by increasing the potential difference across the electrodes above a specified point.

Optionally the step of forming said glow discharge may be assisted by other means such as a magnetron field, a hot filament capable of electron emission, laser, or microwave or radio radiation.

The gas contained within the bubbles may come from or be sourced from the electrolyte and the plasma effects ionisation of the gas within the bubbles. An important feature is that the electrolyte serves as a containment means for the plasma.

The method can be carried out broadly at atmospheric pressure although the pressure within the bubbles can deviate from this pressure by quite a bit. Specifically it is not required to be carried out under vacuum. Optionally the method may be carried out at a pressure below atmospheric pressure.

The electrolyte may comprise:

a carrier liquid;

a source or precursor of the material to be deposited on said one electrode.

The electrolyte may further include additives for enhancing the electrical conductivity of the electrolytes, additives in the form of surfactants for lowering the surface tension of the electrolyte, additives in the form of catalysts for increasing the material deposition rate, additives for assisting the formation of bubbles, additives for buffering the pH and/or reagents to enhance the deposition.

The additives for enhancing the conductivity of the electrolyte may include organic salts or inorganic salts, eg KCl or MgCl2.

The material to be deposited may be transferred from the liquid into the bubbles by diffusion and the material may then be ionised in the bubbles by the formation of the plasma.

The present invention permits the deposition of materials which may be deposited by standard electroplating techniques. These materials include metals such as Chromium (Cr), Zinc (Zn), Copper (Cu), Nickel (Ni), Iron (Fe), Cobalt (Co), Cadmium (Cd), Tin (Sn), Lead (Bb), Silver (Ag), Gold (Au), Indium (Im) and Platinum (Pt). It also includes the alloys and semi conductors such as Germanium (Ge).

This method or process also permits the deposition of a number of advanced materials that are not capable of being deposited by conventional electroplating processes. For example, metalloids such as carbon, boron, silicone and carbon-and titanium-nitride are metalloids that are not capable of being deposited using standard electroplating techniques yet can be deposited using this method.

In addition a number of metals such as titanium, aluminium, vanadium, tungsten, manganese, molybdenum, neodymium and chromium are only deposited using conventional electroplating techniques with extreme difficulty. The reason for this is that these metals have very negative electrochemical potentials in aqueous solution. However, such metals may be deposited using the method or process of this invention.

Compound semiconductors such as GaP, InP, GaAs, CdS, CdSe, CdTe, Bi2S3, Cu2S, ZnSe, InSe, InTe, MoxSey, WxSey, SiOx, Cu2O and TiO2,as well as ternary semiconductors, polymers, and functional biostimulants (Ir2O3, Rb2O3, RuO2, etc.), and biomaterials such as hydroxyapatite may be deposited by the plasma electroplating process of the present invention.

The method or process may also permit the deposition of a film of chromium without the presence of six-valence-chromium. This compound is typically required for conventional electroplating processes and is a toxic compound which is potentially carcinogenic.

In a particularly preferred application said one electrode which is formed by the article is the cathode and the material that is deposited is an advanced material, eg carbon, silicon or titanium.

In alternative applications, said one electrode may form the anode and an oxidative deposition may occur at the anode such as electrophoresis or plasma anodisation. The second electrode is then formed by the cathode.

Generally said other electrode may be either inert or a source for deposition onto the first electrode. Typically such second electrode will be formed from a metallic material eg. aluminium, stainless steel or graphite.

The cathode may be an elongate member, eg a rod-like linear member, and the anode may comprise a plurality of plates extending around the circumference of the cathode spaced outwardly of the cathode.

Alternatively the cathode may comprise a plate having two major surfaces, and the anode may comprise two plates, one each being spaced outwardly away from a said major surface of the cathode.

The bubbles may be formed by introducing a gas into the cell from outside the cell and the bubbles include the source material or precursor material to be ionised by the plasma and subsequently deposited on the article.

In a preferred form the liquid containment means is a rectangular bath having a floor and side walls and wherein the electrodes depend downwardly into the electrolyte from the open top of the bath. It will be appreciated however by persons skilled in the art that the bath may be any shape or size and the electrodes may be oriented parallel to the floor or perpendicular to the floor.

The method may further include cooling the electrolyte to remove excess heat generated by the plasma reaction and regulating the concentration of one or more components within the electrolyte.

The cooling may comprise drawing electrolyte from the bath pumping it through a heat exchanger, and then returning it to the bath.

In conventional electroplating processes bubbles are regarded as a hindrance or obstacle to material deposition. As a result concerted efforts are made to avoid the generation of bubbles during the operation of electro-chemical cells. By contrast the process of the current invention relies on bubbles and utilises bubbles in proximity to the electrode as an essential feature of the invention. The bubble sheath surrounding the electrode is essential to establishing a plasma region which then gives rise to the plasma deposition on the article.

In addition, conventional electroplating is limited to using aqueous based electrolytes. However this limitation does not apply to the method of this invention. Accordingly a wider selection of electrolytes including organic solvent based systems may be used. Further, metal ions are not required, in the process of the current invention, to be dissolved in aqueous solution to provide a source of the species desired to be deposited. All that is required is that the source of material to be deposited be contained in the gaseous bubbles adjacent the electrodes.

According to another aspect of the invention there is provided an apparatus in the form of a system for depositing a material on a surface of an article, comprising:

a cell having a bath and a pair of spaced electrodes, namely a cathode and an anode immersed within the cell, one of which is formed by the article to have material deposited thereon;

a liquid electrolyte within the cell;

means for generating a stream of bubbles proximate to the cathode; and means for applying a potential difference across the electrodes such that a glow discharge is formed proximate to said one electrode.

The electrolyte may include any one or more of the components or other features described above with reference to the first aspect of the invention.

The means for generating a stream of bubbles may comprise said electrodes evolving bubbles due to electrolysis. Alternatively the means for generating a stream of bubbles may comprise an ultra-sonic generator for transmitting ultra-sonic waves into the electrolyte.

The means for applying a potential difference across the electrodes may comprise an electrical power supply capable of applying a potential difference of up to 3000 V. More typically the power supply may be capable of applying a potential difference of 250 to 1500 V. The power is typically DC and may be steady or pulsed, eg pulsed at high frequency.

The apparatus may further include partition means for partitioning the bath into a cooling region and a recirculating region.

The apparatus may include means for drawing electrolyte off from the cooling region of the bath, cooling the electrolyte by heat exchange and then returning it to the bath.

The apparatus may further include means for topping up the level of electrolyte within the bath as and when required and means for regulating the concentration of one or more components within the electrolyte.

In essence the process described above provides both a technique for the deposition of advanced materials as well as a convenient alternative plating system to conventional electroplating techniques. The essence of the process resides in inducing a state of non-equilibrium in a precursor material contained in a sheath of bubbles adjacent an electrode to provide the energy and velocity to effect efficacious deposition. This is achieved by applying an electric field of sufficient strength generate a plasma glow discharge in the bubbles. The ionised and energised ions are then deposited and bonded to the surface at a very high but localised temperature.

Thus the precursor or source material to be deposited is ionised in the bubbles surrounded by liquid which effectively provides a chamber with containment for the various reactions to occur.

Plasma glow discharge can be fairly easily accomplished within the cell because the sheath of bubbles has the effect of causing a substantial proportion of the voltage drop to occur across the bubble sheath. It is concentrated in this area rather than a linear drop across the electrode space. This provides the driving force to generate plasma glow discharge and from there deposition of the ionic species.

DETAILED DESCRIPTION OF PREFERRED EMBODIMENTS AND EXAMPLES

A method for depositing an advanced material on an article and an apparatus for carrying out this deposition may manifest itself in a variety of forms. It will be convenient to hereinafter describe several preferred examples and embodiments of the invention in detail with reference to the accompanying drawings. The purpose of providing this detailed description is to instruct persons having an interest in the subject matter of the invention how to carry the invention into practical effect. It is to be clearly understood however that the specific nature of this detailed description does not supersede the generality of the preceding broad description. In the drawings:

FIG. 5 shows the initial formation of a bubble sheath around the cathode due to the application of voltage across the electrodes;

FIG. 6 shows the bubble sheath around the cathode during stable glow discharge within the cell;

FIG. 7 is a schematic top plan view of one possible arrangement of a cathode and anodes in the cell;

FIG. 8 is a schematic top plan view of another possible arrangement of a cathode and anodes in the cell;

Figure 2:
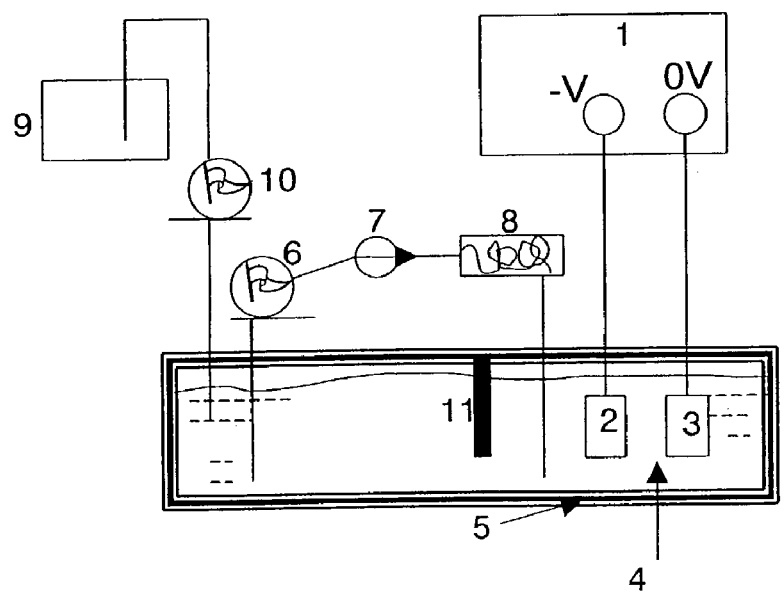
FIG. 2 is a schematic flow sheet of apparatus in the form of a cell for carrying out the invention.

In FIG. 2 reference numeral 1 refers generally to apparatus in the form of a cell and associated components for carrying out a plasma electroplating process (PEP) in accordance with the invention.

The cell 1 comprises broadly a liquid containment means in the form of a bath which is filled with an electrolyte which also forms part of the apparatus or cell.

A pair of spaced electrodes are positioned in the bath, one being a cathode and the other being an anode. The article on which a film is to be deposited forms the cathode.

An electrical circuit is formed by electrically connecting up the anode and cathode to a power supply, e.g. a mains power supply. When the bath is being used a potential difference is applied across the electrodes.

A partition divides the bath into an electrode compartment and a circulating compartment. Electrolyte is drawn off the circulating compartment and pumped through a heat exchanger to cool it and then return it to the bath. This helps to keep the temperature of the electrolyte within a suitable range during operation. In addition a make up tank is positioned adjacent the circulating compartment to replenish the level of electrolyte within the bath as and when required.

The apparatus also includes means for producing a bubble sheath around the cathode. The bubbles can be generated by gas evolved at the cathode as a result of the cathodic electrochemical reaction. This is one of the ways in which the bubbles were generated in the experiments conducted by the applicant.

There are however alternative ways of generating the bubbles for the bubble sheath. One alternative way is by boiling the solution (ebullition bubbles). Other ways of producing the bubbles are by cavitation generated by ultrasonic waves or by hydrodynamic flow. Entrainment bubbles can also be produced by a mixture of gas and liquids.

Figure 3:
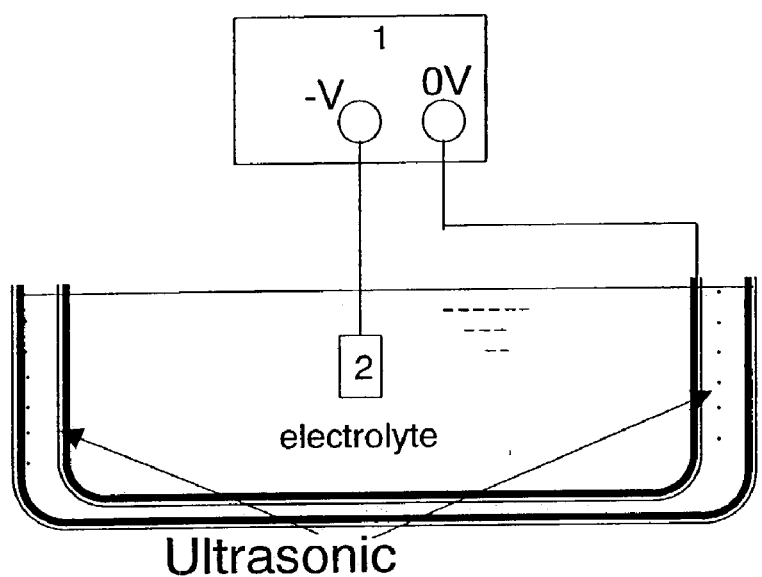
FIG. 3 is a schematic view of a bath for the cell of FIG. 2 having an ultrasonic generator for generating bubbles.

FIG. 3 illustrates an ultrasonic generator surrounding a bath similar to that in FIG. 2. The generator generates ultrasonic waves which are transmitted into the electrolyte liquid and act to generate bubbles in the electrolyte which then surround the cathode.

The cathode which typically provides the surface for deposition can be formed of a conductive material, a semi-conductive material or a non-conductive material, coated with a conductive coating. Cathodic materials that have been successfully used in this method are nickel, mild steel, stainless steel, tungsten and aluminium. The cathode can be in the form of either a plate, a mesh, a rod or wire. There may be any number of cathodes and the cathodes can be any shape or size.

Any conductive material can be used for the anodes. Graphite, aluminium and stainless steel have all been successfully used to practice this method by the applicant. Generally aluminium is preferred for the anodes. Even though the deposition of materials occurs at the cathode and not at the anode it can still affect the cells. It can introduce impurities into the electrolyte. Electrolytic dissolution and passivation can increase resistance across the electrodes and retard or stop the deposition process. Similarly there may be any number of anodes and the anodes can be any shape and size. Optionally the anode may be formed by the containment means or bath of the cell.

FIGS. 7 and 8 illustrate two alternative electrode configurations. It is to be clearly understood that these are example configurations and countless other configurations could equally be adopted. In FIG. 7 four plate anodes are arranged around a central rod-like cathode spaced radially outwardly thereof. This causes deposition to occur around the full circumference of the cathode. The distance from the cathode to the anode is generally greater than 10 mm so that the anode does not interfere with the formation of the bubble sheath. Typically the distance may be in the range of 10 to 40 mm.

FIG. 8 illustrates a plate cathode having two major surfaces with two anodes extending parallel to the cathode spaced away from each of the major surfaces of the cathode. The reason for the two anodes is so that deposition occurs on both major surfaces of the cathode. If there was only one anode then the electrical field distribution would only effect deposition on the one side of the cathode.

The bath is filled with an appropriate electrolyte. The electrolyte contains broadly a solvent or carrier which provides a liquid environment within which electrolysis can occur and which also provides a support for plasma generation in the sense that it provides containment for the plasma generation. The electrolyte also contains a source of the material to be deposited in the form of a precursor. The electrolyte may also include additives for example for enhancing the electrical conductivity of the electrolyte and also for assisting in bubble formation and a buffer to maintain a suitable pH in the cell.

In use the article to be coated is placed in the bath where it typically forms the cathode. In some instances however it may also form the anode.

A voltage or potential difference is then applied across the electrodes and this voltage is set at a level that is higher than the firing point at which the system or cell achieves a stable glow discharge in which glow clusters envelope the cathode surface.

Figure 4:
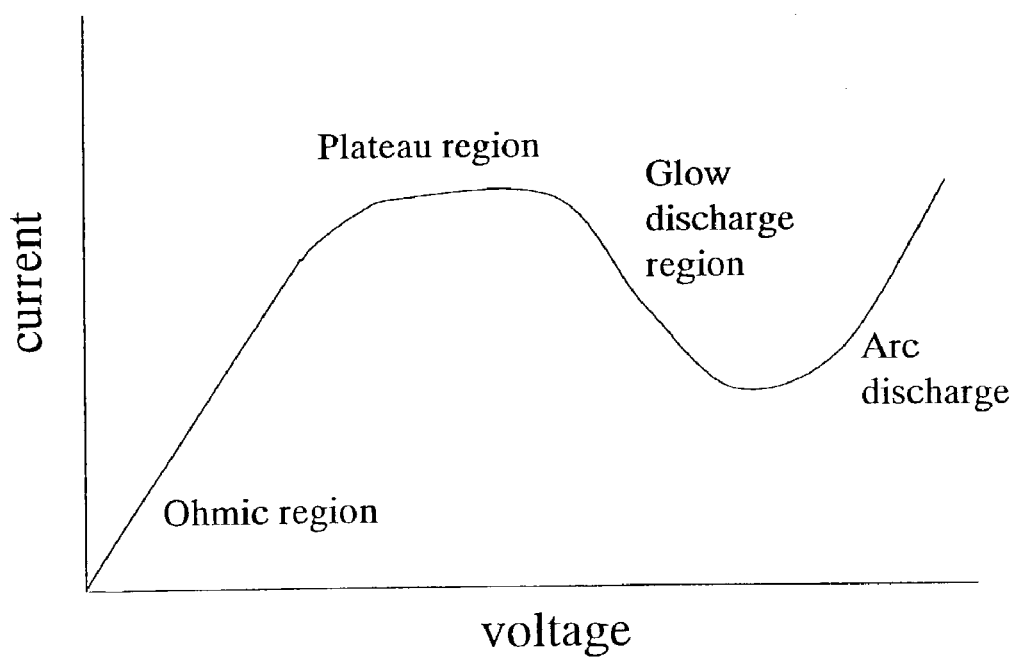
FIG. 4 is a schematic graph of current against voltage in an electrolytic cell.

FIG. 4 illustrates a typical current against voltage profile for such a cell as the voltage is progressively increased. Initially there is an ohmic zone where the current increases proportionally with the voltage. After that the curve enters an oscillation zone where the current starts to oscillate. Applicant believes that this condition may be due to the fact that bubbles are evolving out of the solution and partly obscuring the electrodes. The bubbles form plasma, grow and then burst forming a shield shrouding the electrode. These bubbles break the conducting part of the cathode and this might lead to a decrease in apparent current density.

At the cathode the evolved bubbles include hydrogen generated by the electrolysis of water in the electrolyte and also by evaporation of liquid within the electrolyte. The bubbles may also be generated by other means as described above, for example ultrasonic generation.

After some time the number and density of bubbles increases until the entire cathode surface is sheathed in bubbles. At a critical voltage that is constant for a given system, known as the fire point, a glow discharge is formed. Experimental observation shows that this occurs when there is a near continuous bubble sheath around the cathode.

With a wire cathode, a tiny fireball or cluster of fireballs usually appears at the tip of the wire at the fire point. With further increases in voltage a glow discharge is established across the entire cathode. The glow discharge is dynamic and usually shows evidence of glow clusters and/or flashing through the bubble region.

The glow discharge is caused by a dielectric breakdown in the bubbles. This is caused mainly by a high electrical field strength. Due to the presence of the bubbles the majority of the voltage drop from the anode to the cathode occurs in the near cathode region occupied by the bubbles. The electric field strength in this region may be of the order of $1 \times 10^4$ to $1 \times 10^5$ V/m.

The voltage is set at a setting of 50 to 100 volts higher than the ignition point. This may typically mean a setting of 250 to 1500 volts. A preferred voltage setting would be at the low point of the graph in FIG. 4 within the glow discharge region.

Figure 1:
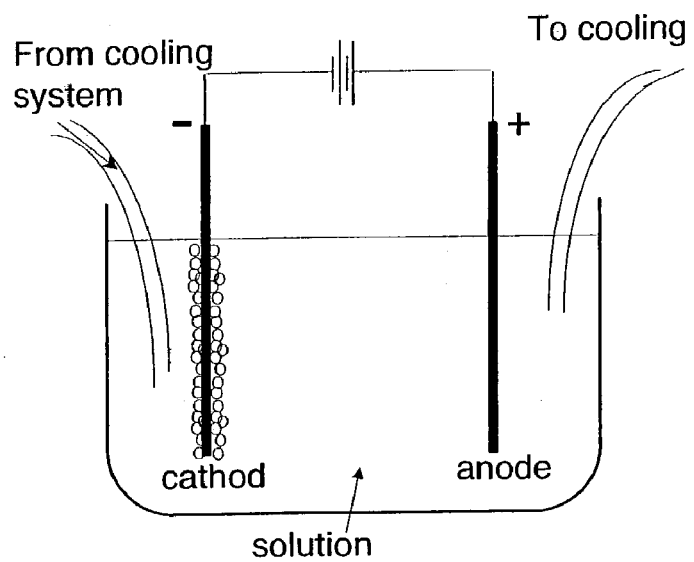
FIG. 1 is a schematic representation of the plasma electroplating process in accordance with the invention.

The glow discharge causes the generation of a plasma in the bubble. FIG. 5 shows the formation of a bubble sheath around the cathode. FIG. 6 shows the cathode during stable glow discharge. As shown in the drawings, applicant has observed the formation of two distinct zones during stable glow discharge. This overall process is schematically illustrated in FIG. 1.

In zone 1 where the glow discharge clusters are present there is a plasma envelope that directly shrouds the cathode surface. This envelope is where plasma deposition takes place. The plasma interacts with the cathode surface in a process similar to ion plating and deposition occurs. A film is progressively formed through nucleation and growth on the cathode surface.

Zone 2 is a plasma-chemical reaction zone which forms the interface between the electrolyte and zone 1. This zone envelopes the plasma deposition zone and is often clearly visible as a separate region with a milky appearance.

Dissociation and possibly also ionisation of the electrolyte components, including the precursor, occur in the outer zone or zone 2. This gives rise to the species that are deposited on the cathode. The species is transferred from the outer zone 2 to the inner zone 1 by the electric field strength, diffusion, and convection.

Deposition on the cathode then occurs for as long as these conditions are maintained and the precursor material is available in the electrolyte.

After the glow discharge commences the temperature of the electrodes increases in a short space of time. The temperature of the electrolyte must be maintained within acceptable limits. To do this electrolyte is drawn off from the bath and pumped through a cooling system as shown in FIG. 2. The cooled electrolyte is then re-introduced back into the bath. This cooling is required for both stability and safety reasons. Most of the electrolyte components are flammable. In addition electrolyte is consumed during the deposition reaction. Accordingly it is necessary to replenish the bath with make up amounts of electrolyte from time to time. A replenishment tank containing electrolytes is provided to perform this purpose.

Experiments have been conducted to assess the efficacy of deposition of three materials namely carbon, titanium and silicon. These experiments are described separately below.

Carbon:

Experiments have been conducted on the cell shown in FIG. 2 to coat a film of carbon on an article forming the cathode of the cell.

The electrolyte consisted of:

| Component | Material | Amount |
| --- | --- | --- |
| Precursor | Ethanol (Ar) | 50 to 100 volume % |
| Solvent | Distilled Water | 0 to 50 volume % |
| Additive | KCl, KAc or MgCl, | Small amount |
| Buffer | pH 7 standard buffer solution | Small amount |

A stable glow discharge was established in the cell and then deposition was carried out at a cathode voltage of minus 450 volts for 30 minutes.

This led to a deposit on the cathode that was clearly visible on the SEM images that were obtained. Carbon film was deposited on several wire and plate cathodes as well as a nickel TEM grid.

Figure 9:
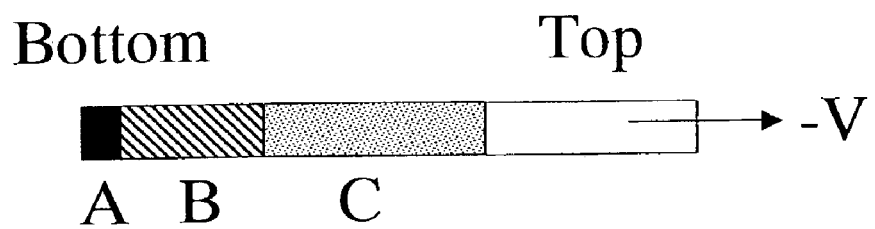
FIG. 9 is a schematic drawing showing differing regions along the length of a cathode that has been coated with carbon in accordance with the invention.
Figure 10:
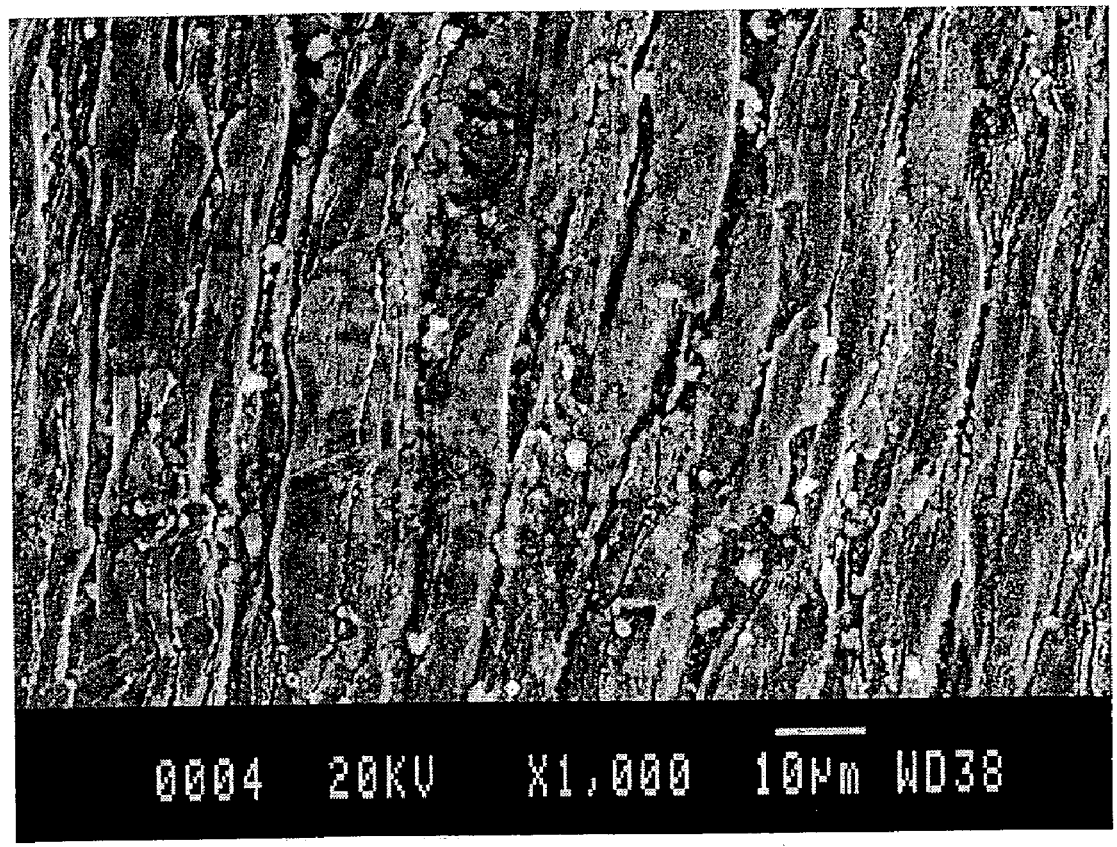
FIG. 10 is an SEM image of a wire cathode showing the morphology of the substrate or surface of the cathode.
Figure 11:
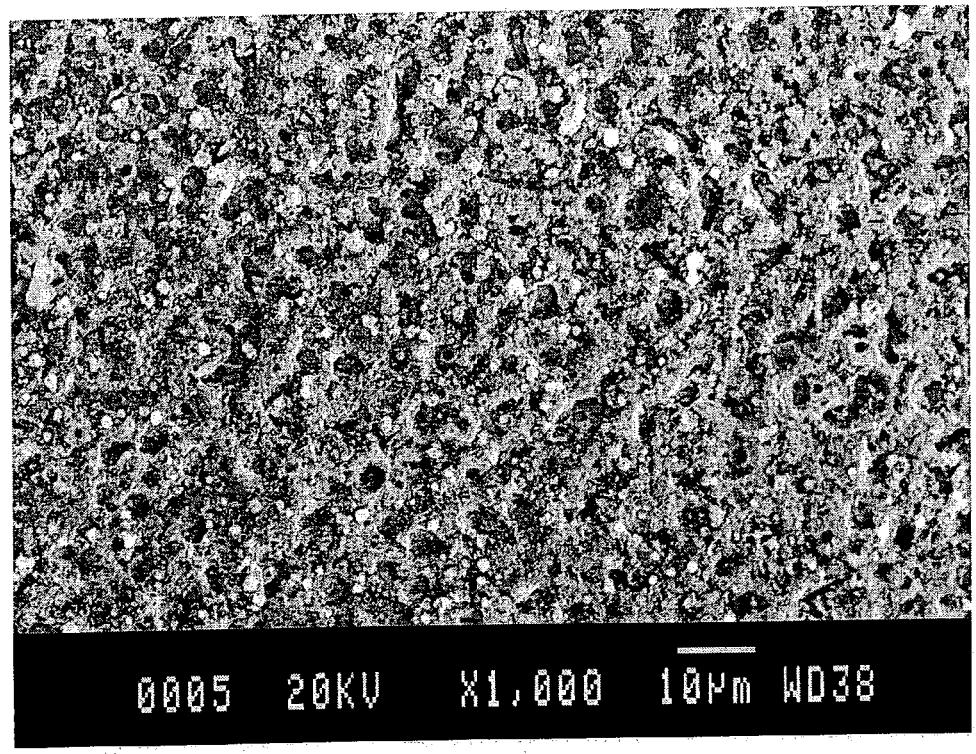
FIG. 11 is an SEM image of region A of the cathode of FIG. 9.
Figure 12:
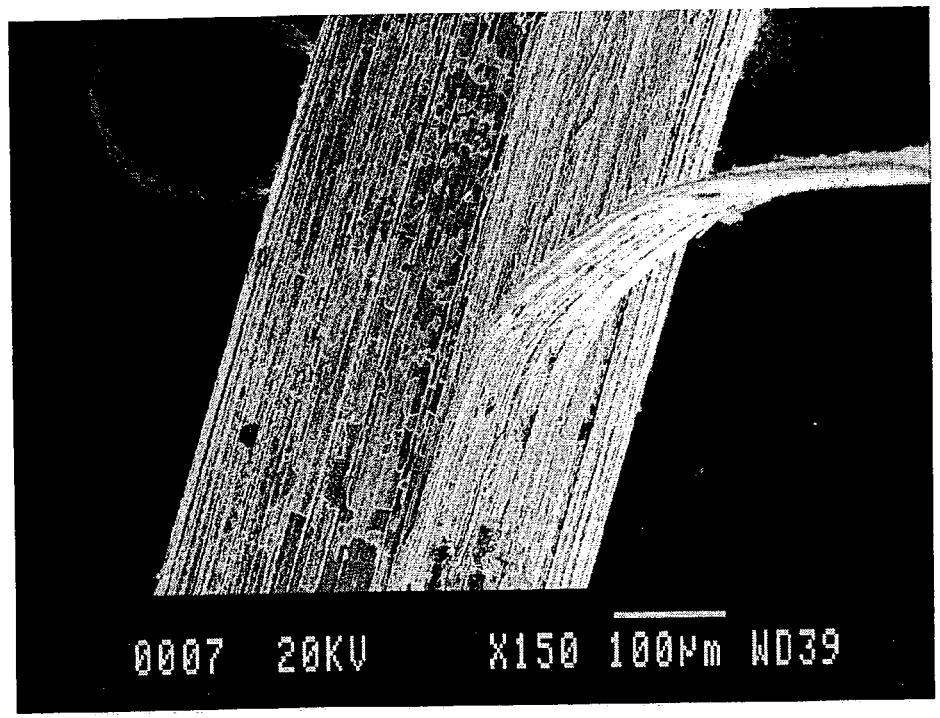
FIG. 12 is an SEM image of regions B and C of the cathode of FIG. 9.
Figure 13:
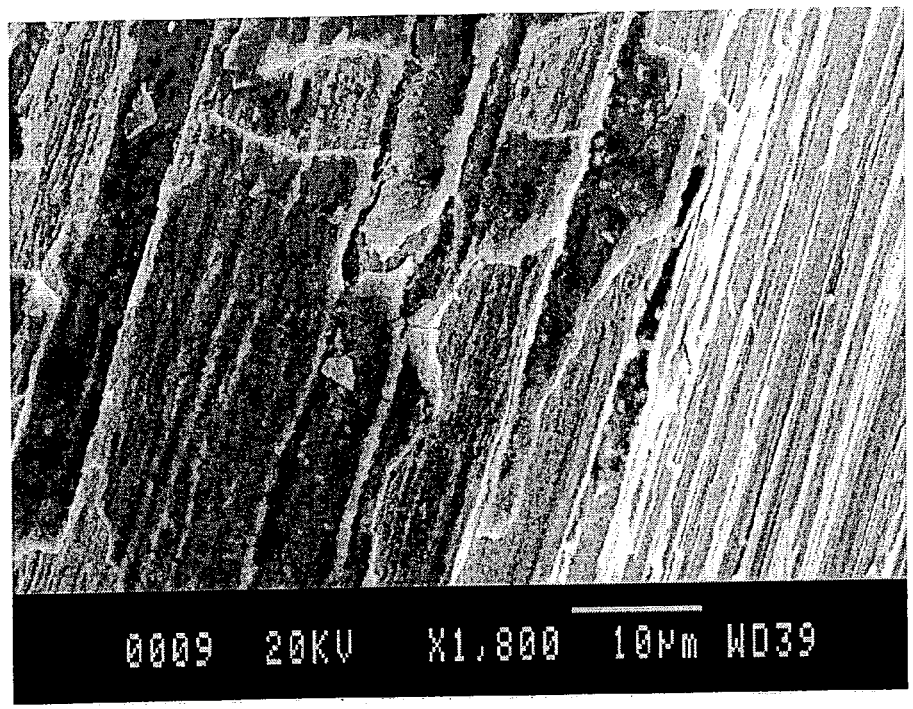
FIG. 13 is an SEM image of the region B or C at a higher magnification than FIG. 12.
Figure 14:
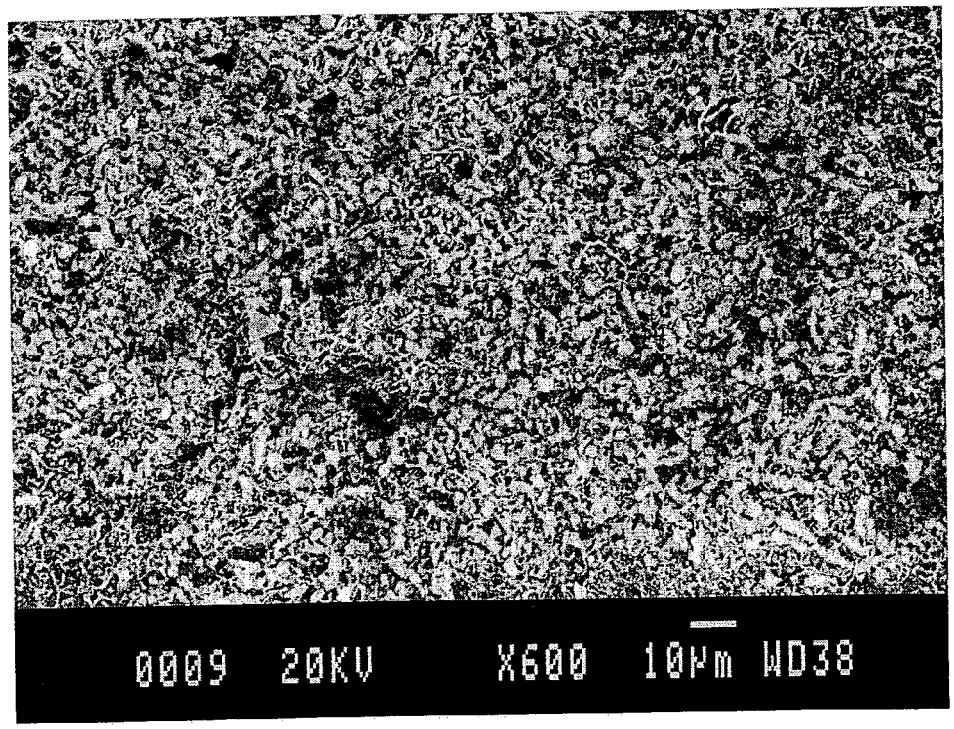
FIG. 14 is an SEM image of a region of a plate cathode broadly corresponding to region A of the cathode of FIG. 9.
Figure 15:
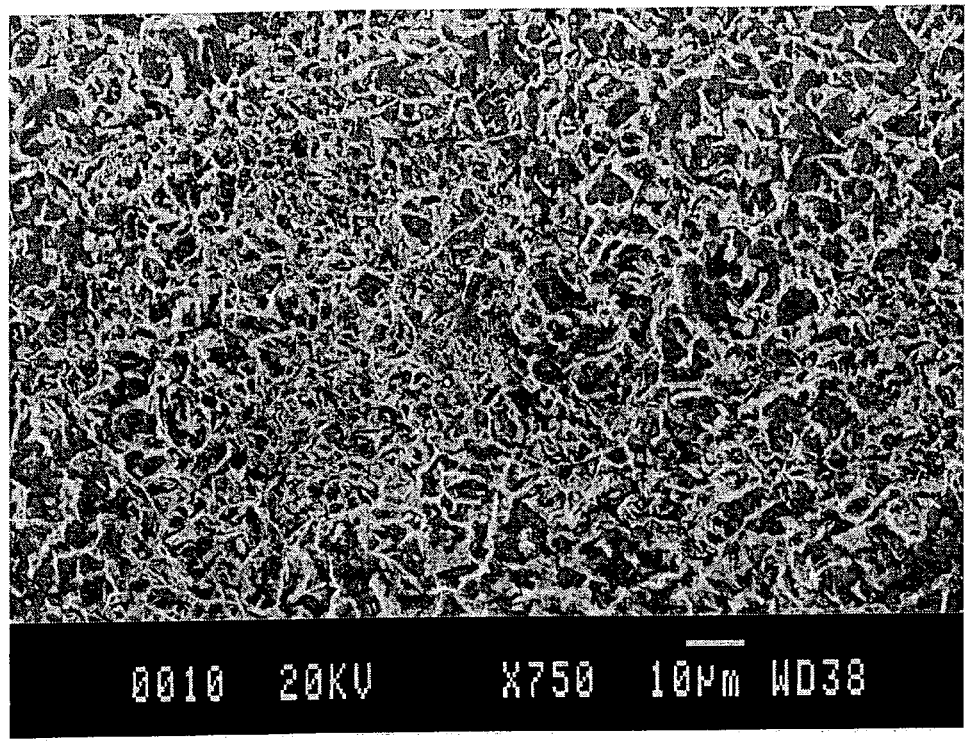
FIG. 15 is an SEM image of a region of a plate cathode broadly corresponding to region B of the cathode of FIG. 9.
Figure 16:
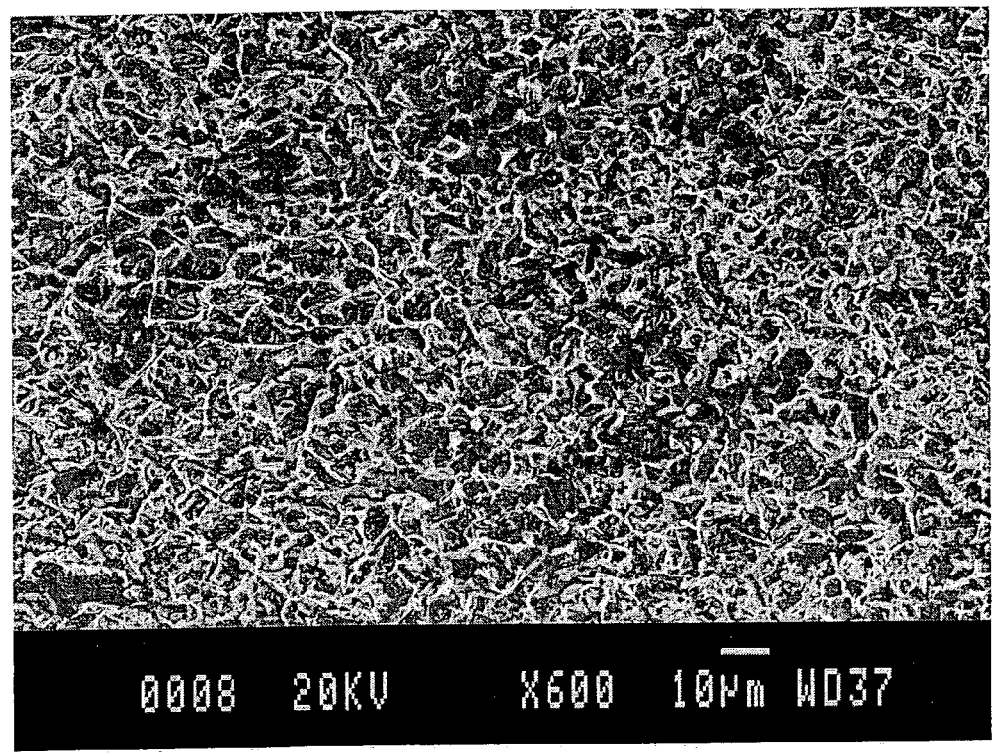
FIG. 16 is an SEM image of a region of a plate cathode broadly corresponding to region C of the cathode of FIG. 9.
Figure 17:
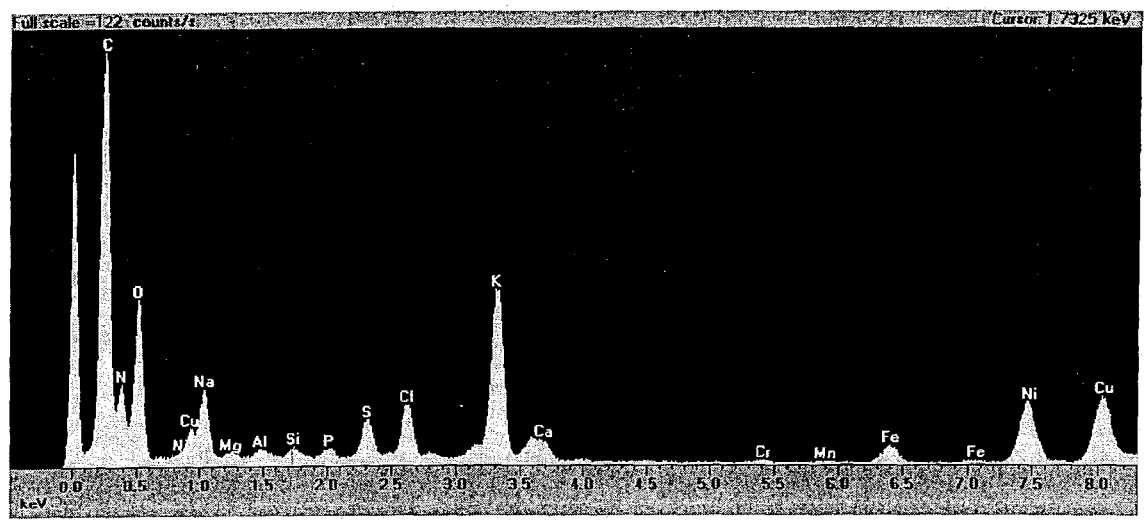
FIG. 17 is an SEM component analysis spectrum of the carbon film deposited on the cathode of FIG. 9.

FIG. 9 shows the different regions of the cathode that was deposited with carbon. FIGS. 10 to 15 show various SEM images of respectively wire and plate cathodes.

The SEM images clearly indicate the existence of a carbon coating on the cathode substrate. Further the EDAX compositional analysis spectrum clearly shows that the film is predominantly carbon with some traces of potassium, oxygen and chlorine.

Applicant believes without being bound by theory that the potassium and chlorine come from the KCl additives used in this solution and that the oxide is caused by exposure to air.

Figure 18:
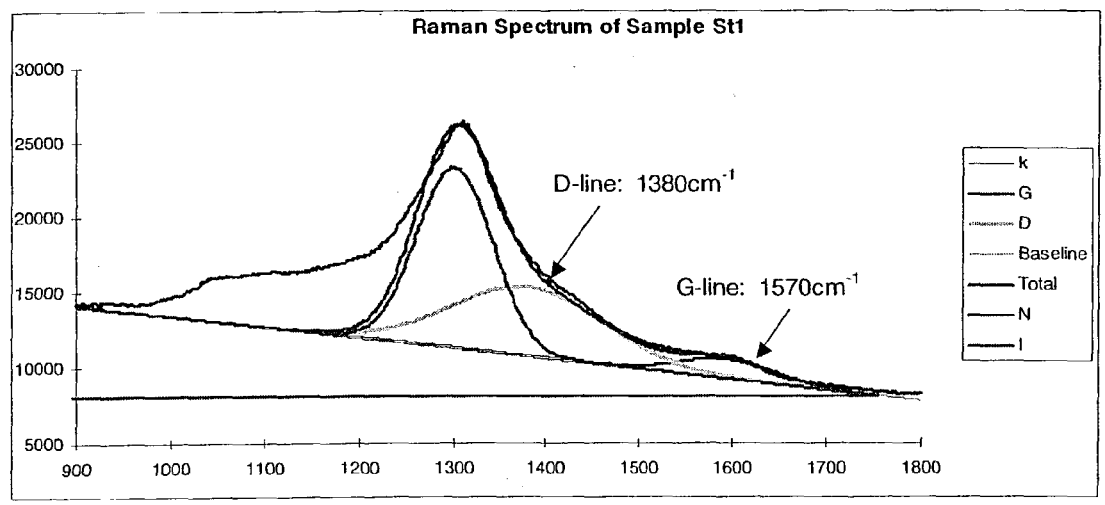
FIG. 18 is a Raman spectrum of a coated sample.

A Raman spectroscopy was also carried out on the coating to analyse the bonding structure of the coating. This is shown in FIG. 18.

This showed some Raman peaks in the 1,300 to 1,400 $cm^{-1}$ and 1,550 to 1,600 $cm^{-1}$ ranges consistent with the presence of amorphous carbon in the coating and it is supported by TEM.

In summary a carbon film was definitely deposited on the cathode. The carbon was in the form of amorphous hydrogenated carbon with a substantial amount of the deposited carbon having a diamond like bonding pattern. Generally the coating is relatively dense and smooth.

Titanium:

Films or coatings of titanium experiments have also been conducted on the cell shown in FIG. 2 to coat films or coatings of titanium onto a number of cathodes.

The electrolyte used in these experiments had the following composition.

| Component | Material | Amount |
|---|---|---|
| Precursor | Ti(OPr)$_4$ | 50 volume % |
| Solvent | Ethanol | 50 volume % |

The precursor is the source of titanium material that is ultimately ionised by the plasma in the bubble sheath surrounding the cathode and then subsequently deposited on the cathode. The precursor used in this instance is titanium (IV) tetrapropoxide.

The expected reaction is as follows:

$$Ti(OPr)_4(l) \rightarrow Ti(OPr)_4(g)$$

$$Ti(OPr)_4(g) \rightarrow Ti^+ + 4OPr^-$$

$$2H_2O(l) + 2e^- \rightarrow H_2(g) + 2(OH)^-$$

Applicant believes that the ionised components and the plasma may comprise one or more of the following: titanium ions, hydrogen ions (protons), oxygen ions (negative ions), and possibly hydrocarbon radicals $CH_4^+$, $C_2H_2^+$ or $C^+$.

A stable glow discharge was first established in the cell and then deposition took place at a cathode voltage of −800V and a current of 250 mA for 30 minutes.

Figure 19:
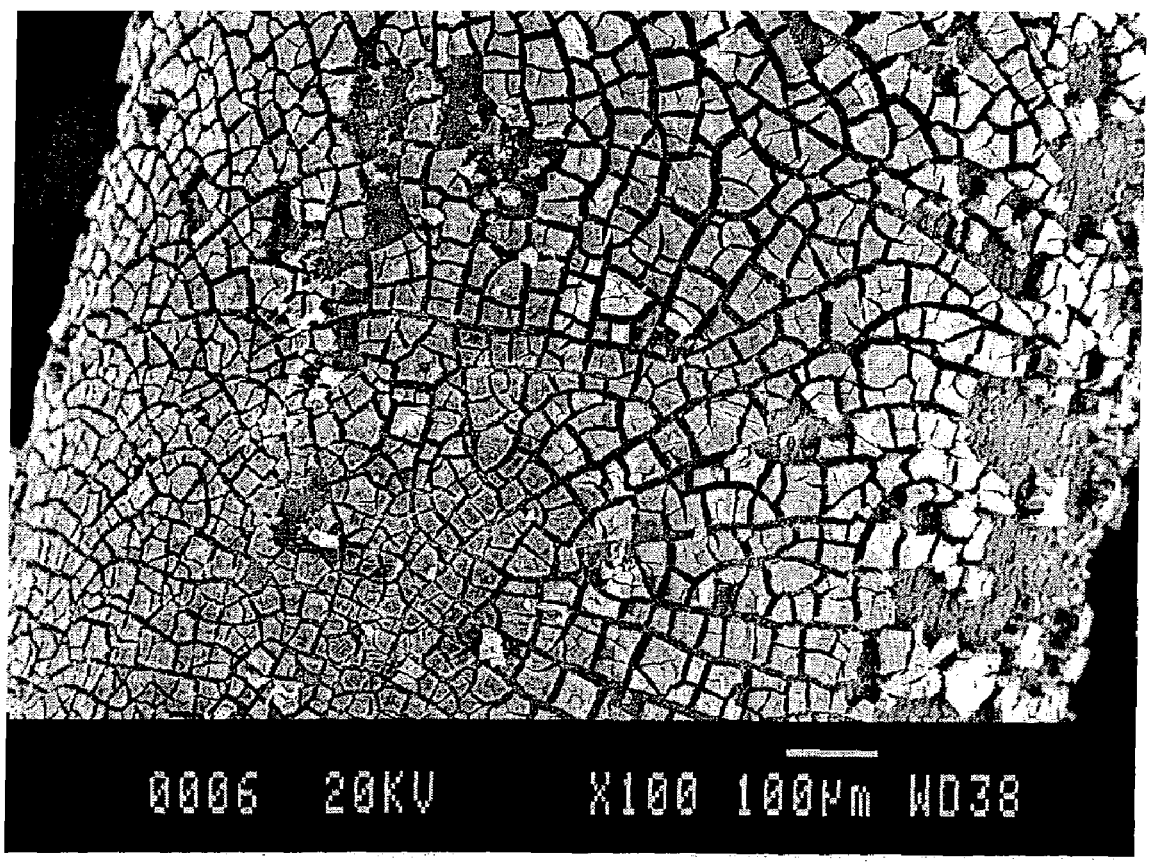
FIG. 19 is an SEM image of a titanium film deposited on a wire cathode.
Figure 20:
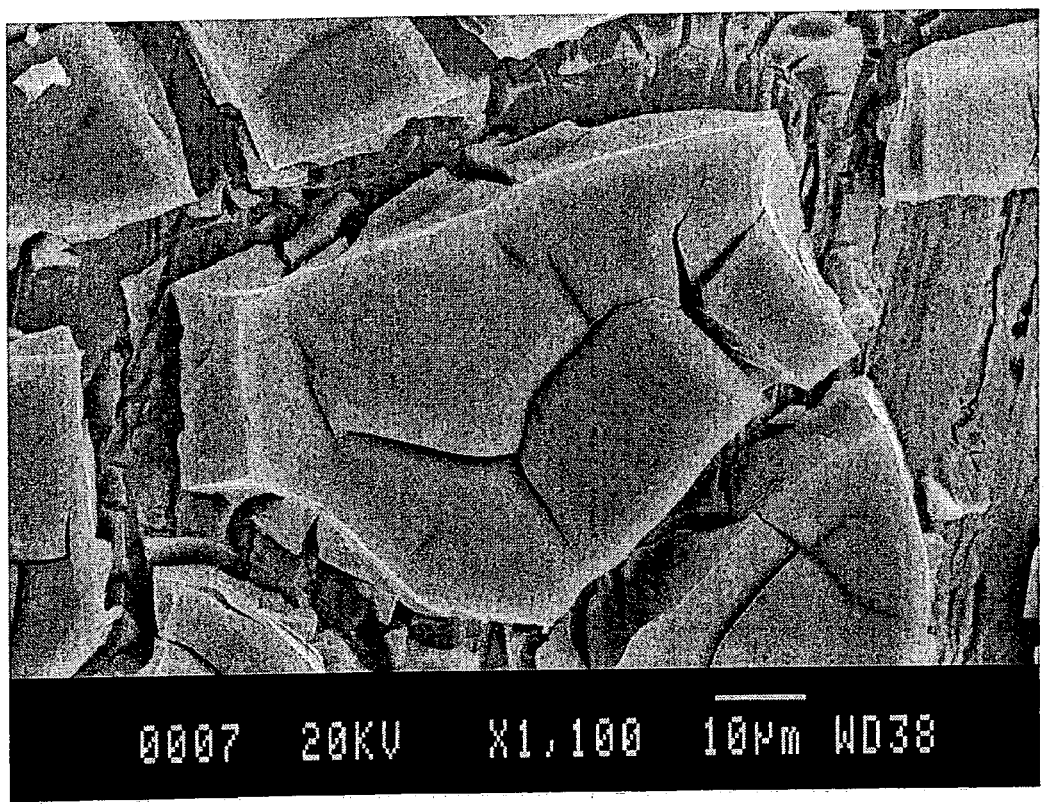
FIG. 20 is an SEM image of the film shown in FIG. 19 but at a higher magnification.

A number of SEM images were obtained of the cathode surface after it had been subjected to the deposition and these are shown in FIGS. 19 and 20. The SEM images clearly show the presence of the coating on the wire. The coating was very thick having a thickness of about 10 μm. Applicant estimates that the coating was deposited at a rate of 0.33 microns per minute. The coating also had cracks clearly shown in the images which could be explained by the high rate of deposition and entrapment of hydrogen.

Figure 21:
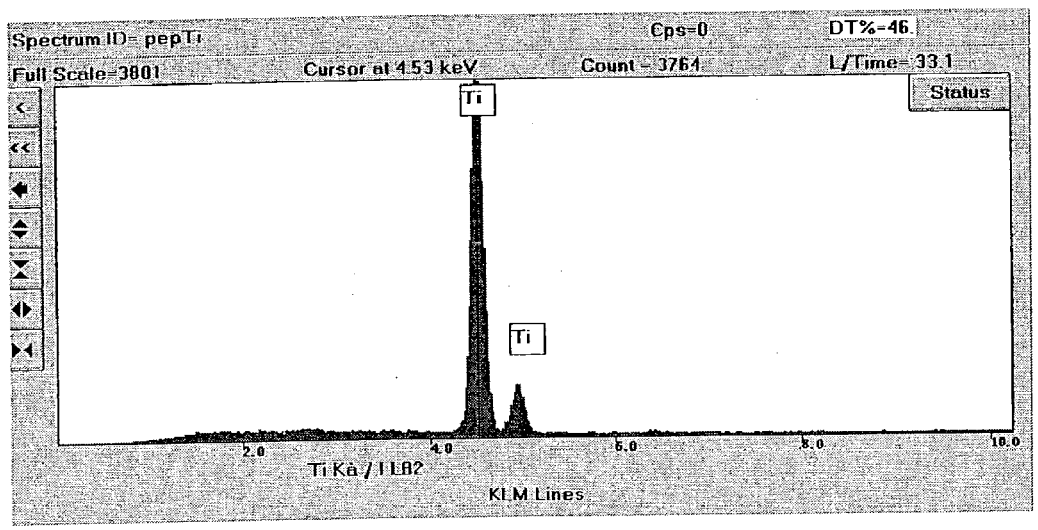
FIG. 21 is an EDAX spectrum of a coated region of the image shown in FIG. 19.
Figure 22:
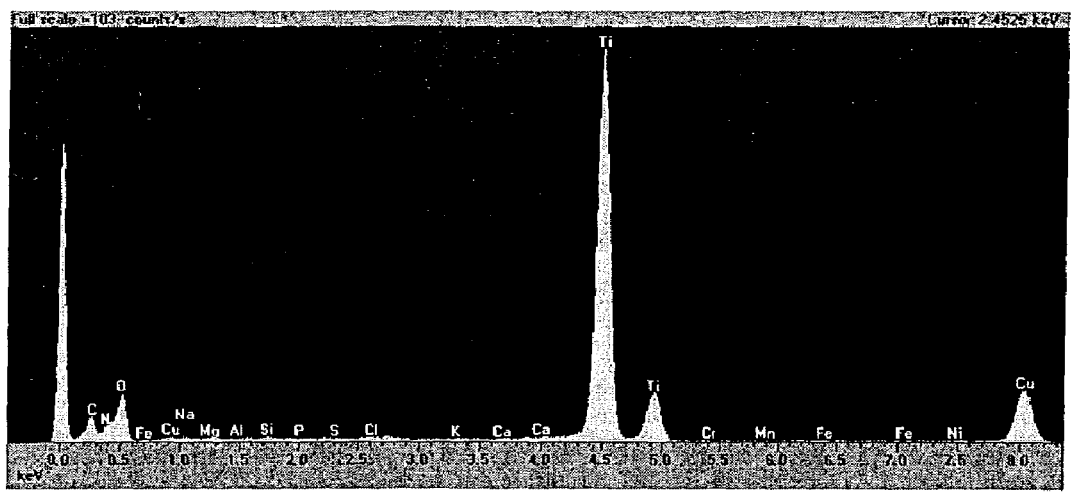
FIG. 22 is an SEM compositional analysis of a titanium coating on a copper cathode.

The EDAX spectrum of the film or coating is shown in FIG. 21. This spectrum shows a strong titanium signal indicating a preponderance of titanium in the coating. The results confirm that Al from the anode does not contaminate the coating. There is also a very minor oxygen peak probably formed by the surface oxidation of titanium when the sample was removed from the deposition chamber.

A further experiment was done on this system with the presence of the bubble sheath. However the voltage was deliberately kept below the ignition point and therefore out of the glow discharge region. The treated electrodes showed no evidence of film deposition thereby clearly indicating the important role of operating within the glow discharge region of the I-V curve.

Silicon:

Films of silicon have also been successfully deposited on a cathode using the apparatus shown in FIG. 2.

The electrolyte used in these experiments consisted of:

| Component | Material | Amount |
|---|---|---|
| Precursor | Si(Oac)$_4$ | 0.2–1.2 Mol |
| Solvent | Ethanol | 100 volume % |
| Additive | — | |
| Buffer | — | |

The source of silicon in this experiment was silicon tetra-acetate or tetra-acetoxysilane. This material is a white powder which can dissolve in alcohol.

The ionised components in the plasma may include one or more of the following: silicon ions, hydrogen ions and oxygen ions. They may possibly also include hydrocarbon radicals and also carbon ions.

A glow discharge was established in the cell and then deposition took place at a voltage of −500V and a current of between 160 and 200 mA for 30 minutes.

Figure 23:
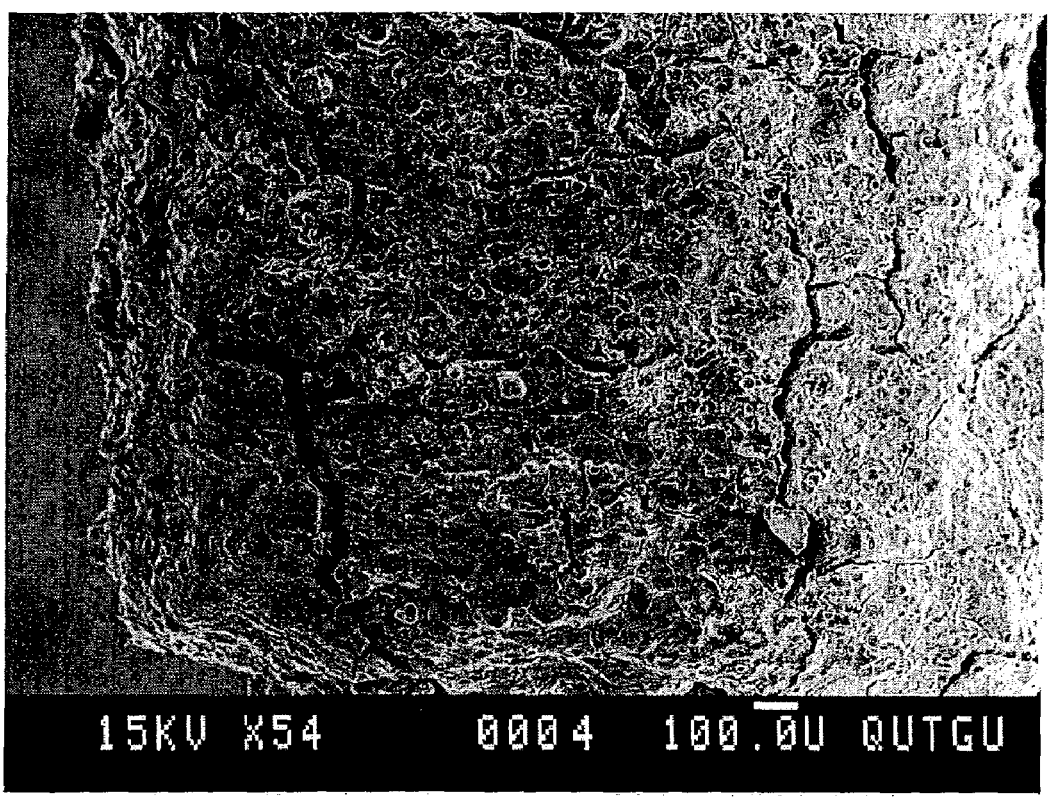
FIG. 23 is an SEM image of a film of silicon deposited on a wire cathode.
Figure 24:
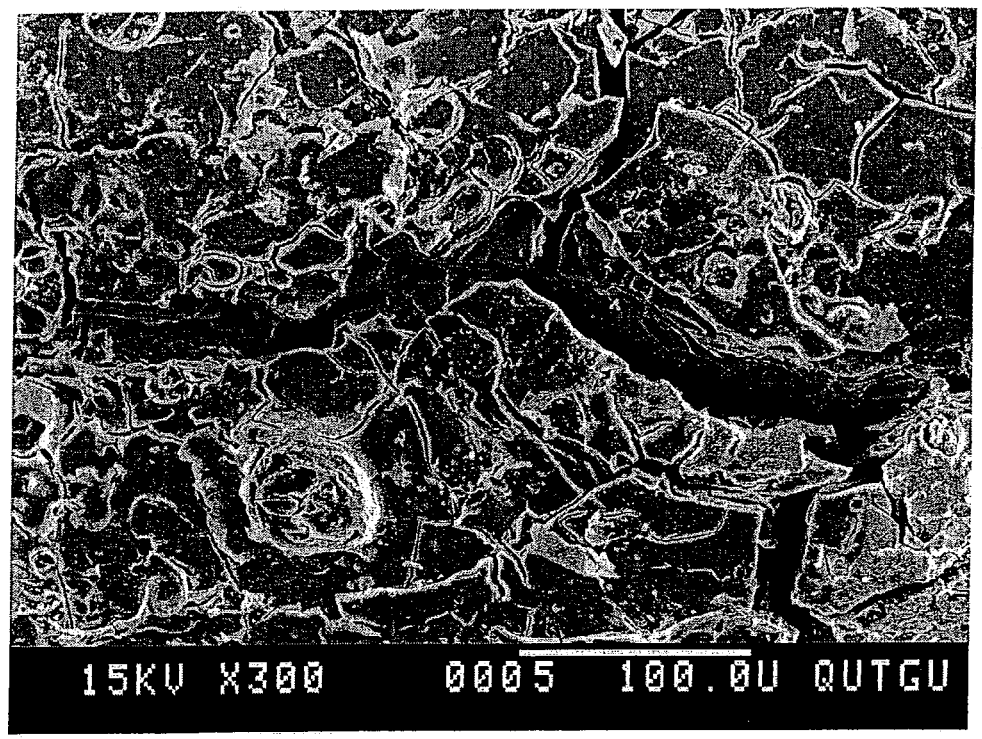
FIG. 24 is an SEM image of part of the film of FIG. 23 shown at a higher magnification.
Figure 25:
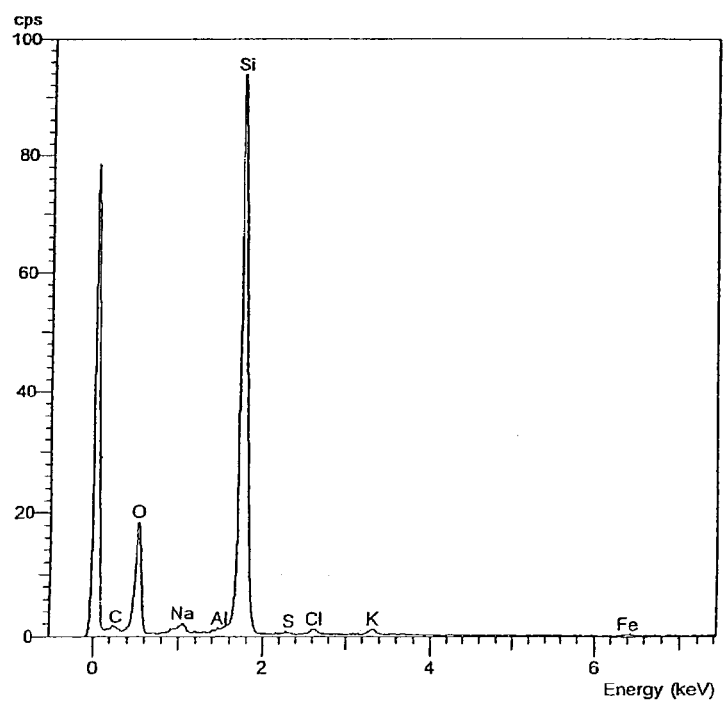
FIG. 25 is an EDAX spectrum of the coated region shown in FIG. 24.

SEM images were obtained of the coating that was deposited on the cathodes. These are shown in FIGS. 23 and 24. The EDAX spectrum for the coating is shown in FIG. 25 revealing a predominant silicon peak.

A gray coating having a thickness of about 0.5 mm was clearly deposited on the cathode. In fact this coating was quite apparent to the naked eye. The coating appears to have a plate-like structure with some cracking suggesting high internal stresses.

The method described above in the examples has shown how to successfully deposit advanced materials such as carbon, titanium, and silicon on a work piece or article serving as an electrode in an electrolytic cell. The process can be carried out in a relatively simple bath at atmospheric pressure without a vacuum chamber. The liquid electrolyte provides for containment of the plasma within the liquids. This provides a very simple and effective containment means. The plasma in turn provides the energy to effect the deposition.

In addition the silicon and titanium coatings were deposited very quickly and produced very thick coatings in a relatively short space of time. This is significant and indicates that the technology has huge potential.

Applicant also mentions that it is possible to include more than one precursor with more than one ionic species in the electrolyte. This would enable the method to be used to deposit coatings containing more than one species, e.g. and alloys.

One particular advantage of this technology is that it can be used to evenly coat the full periphery of a three dimensional surface of an article including particularly intricate articles. It is not limited to coating one side of a substantially planar article.

Another advantage is that this process or method has the ability to coat articles having a wide range of sizes. A relatively larger article can easily be accommodated within a relatively larger bath and coated accordingly. Other techniques do not have this advantage.

It should also be appreciated that the process could also be used for the recovery of materials from a liquid, particularly low grade concentrations of material. The process would be used to deposit material as a way of recovering the material. It would be analogous to the electrowinning of copper ions from solution using an electrochemical cell.

It will of course be realised that the above has been given only by way of illustrative example of the invention and that all such modifications and variations thereto as would be apparent to persons skilled in the art are deemed to fall within the broad scope and ambit of the invention as herein set forth.

The invention claimed is:

1. A method for depositing a material on a surface of an article, comprising:
providing a bath containing an electrolyte and a pair of spaced electrodes wherein one electrode forms the article;
generating within the electrolyte a stream of bubbles which contain a source of the material to be deposited until a continuous bubble sheath has formed around the electrode forming the article; and
applying a potential difference across the electrodes, the potential difference being sufficient to form a stable glow discharge in the continuous bubble sheath and to plasma deposit said material on said article.

2. The method according to claim 1, wherein the generation of bubbles is accomplished by at least one of the group consisting of electrolysis, ebullition, cavitation, entrainment, sparging, chemical reaction, dissociation by electrons and ion collisions.

3. The method according to claim 1, wherein the bubbles are generated from components within the electrolyte.

4. The method according to claim 1, wherein the bubbles are generated by introducing a gas, vapour or a gas-liquid mixture into the bath.

5. The method according to claim 4, wherein gaseous molecules within the bubbles come from the electrolyte, the plasma effects ionization of the species within the bubbles and the electrolyte serves as a containment means for the plasma.

6. The method according to claim 1, wherein the glow discharge is formed by increasing the potential difference across the electrodes above a specified point.

7. The method of claim 6, wherein forming said glow discharge is assisted by other means selected from the group consisting of a magnetron field, a hot filament capable of electron emission, laser, microwave radiation and radio radiation.

8. The method according to claim 1, which is carried out at about atmospheric pressure.

9. The method of claim 1, wherein the electrolyte comprises a carrier liquid and a source or precursor of the material to be deposited on said one electrode.

10. The method according to claim 9, wherein the electrolyte further includes at least one additive selected from the group consisting of an additive for enhancing electrical conductivity of the electrolyte, a surfactant for lowering the surface tension of the electrolyte, a catalyst for increasing the deposition rate and a reagent to enhance the deposition.

11. The method according to claim 10, wherein said additive for enhancing the conductivity of the electrolyte is selected from the group consisting of an organic salt and an inorganic salt.

12. The method according to claim 1, wherein the material consists essentially of carbon, wherein the carbon is deposited as diamond-like carbon and the source of the carbon is an aqueous alcohol.

13. The method according to claim 1, wherein the material is selected from the group consisting of carbon, boron, silicon and carbon-and-titanium-nitride.

14. The method according to claim 1, wherein the material is selected from the group consisting of titanium, aluminium, vanadium, tungsten, manganese, molybdenum, neodymium, chromium, a compound semiconductor, a ternary semiconductor, a polymer, a functional biostimulant and a biomaterial.

15. The method according to claim 14, wherein the compound semiconductor is selected from the group consisting of GaP, InP, GaAs, CdS, CdSe, CdTe, $Bi_2S_3$, $Cu_2S$, ZnSe, InSe, InTe, $Mo_xSe_y$, $W_xSe_y$, $SiO_x$, $Cu_2O$ and $TiO_2$ and the biostimulant is selected from the group consisting of $Ir_2O_3$, $Rb_2O_3$, and $RuO_2$ and the biomaterial is hydroxyapatite.

16. The method according to claim 1, wherein the material is selected from the group consisting of Chromium (Cr), Zinc (Zn), Copper (Cu), Nickel (Ni), Iron (Fe), Cobalt (Co), Cadmium (Cd), Tin (Sn), Lead (Bb), Silver (Ag), Gold (Au), Indium (Im) and Platinum (Pt) and mixtures of two or more thereof.

17. The method according to claim 1,
wherein the electrode forming the article is an anode.

18. The method according to claim 1, wherein the electrode forming the article is a cathode.

19. The method according to claim 1 which further includes cooling the electrolyte to remove excess heat generated by the plasma.

20. The method according to claim 1, wherein the electrode that does not form the article is a source of the material.

* * * * *